US005585758A

United States Patent [19]
Prines et al.

[11] Patent Number: 5,585,758
[45] Date of Patent: Dec. 17, 1996

[54] CURRENT SOURCE GATE DRIVE CIRCUIT FOR SIMULTANEOUS FIRING OF THYRISTORS

[75] Inventors: Frank J. Prines, Murrysville; Ray S. Kemerer; Martin I. Norman, both of Monroeville, all of Pa.

[73] Assignee: Electric Power Research Institute, Inc., Palo Alto, Calif.

[21] Appl. No.: 267,860

[22] Filed: Jun. 29, 1994

[51] Int. Cl.$^6$ .............................. H03K 3/86; H01F 27/00
[52] U.S. Cl. ................... 327/438; 327/191; 327/181; 327/460; 327/403; 327/443; 327/205; 363/54
[58] Field of Search ...................... 327/438, 440, 327/442, 443, 403, 181, 190, 460, 191, 182, 183, 184, 205; 363/52, 54

[56] References Cited

U.S. PATENT DOCUMENTS

| | | |
|---|---|---|
| 3,448,300 | 6/1969 | Gyugyi . |
| 3,480,797 | 11/1969 | Bedford et al. . |
| 3,646,578 | 2/1972 | Gregory ........................ 327/109 |
| 3,662,248 | 5/1972 | Amano et al. .................. 327/460 |
| 3,950,693 | 4/1976 | Mitsuoka ....................... 327/460 |
| 4,245,609 | 1/1981 | Gerry ............................ 123/594 |
| 4,547,712 | 10/1985 | Gotal et al. .................... 318/128 |
| 4,682,114 | 7/1987 | Aucouturier et al. ........... 322/183 |
| 5,051,603 | 9/1991 | Walker ........................... 322/403 |

Primary Examiner—Timothy P. Callahan
Assistant Examiner—Dinh T. Le
Attorney, Agent, or Firm—Flehr, Hohbach, Test, Albritton & Herbert

[57] ABSTRACT

A current source gate drive circuit for simultaneous firing of a set of series or parallel thyristors is described. The circuit includes two current loops, each of which serves as a current transformer primary. Electrically insulating tubes enclose the current loops. Current transformer cores, around which are wound a certain number of secondary turns, surround the current loops, thus magnetically coupling the primary current of the current transformer to the secondary turns. Thyristor gate driver circuits are electrically coupled to the current transformer cores. Each of the thyristor gate driver circuits receives and rectifies ac current signals from the current loops and forms a current pulse train firing signal. Each thyristor gate driver circuit has a corresponding thyristor that is fired by the current pulse train firing signal. The thyristors operate at a high voltage, but are electrically isolated from the current loops by the insulating tubes. A current pulse shaping circuit is connected to the current loops and uses dual resonant LC circuits to generate ac current signals. The current pulse shaping circuit operates in a low voltage region and is electrically isolated from the high voltage region by the insulating tubes. The current pulse shaping circuit is activated by an edge-triggered signal. To prevent misfiring of the thyristors, thyristor firing command logic is used to generate a level-trigger signal. Level-triggered logic is responsive to the level-trigger signal, but not noise or transients, and produces a pulse train enable signal that allows the thyristors to be fired.

12 Claims, 10 Drawing Sheets

CURRENT SOURCE GATE DRIVE CIRCUIT FOR SIMULTANEOUS FIRING OF THYRISTORS

BRIEF DESCRIPTION OF THE INVENTION

This invention relates generally to the operation of thyristors in power conditioning devices such as static VAR compensators. More particularly, this invention relates to a current source gate drive circuit operated on the low-voltage side of a power conditioning device to produce a uniform current source pulse stream for the simultaneous firing of thyristors within the power conditioning device.

BACKGROUND OF THE INVENTION

Solid state power electronics are used in conjunction with high voltage transmission lines to improve system performance. Operations to improve system performance include power factor correction, voltage regulation, and resonance damping. These operations are executed as solid state power electronic devices rapidly switch high voltage capacitors and inductors. This switching operation is realized by several thyristor power semiconductors connected in series so as to withstand the maximum expected line voltage. Each thyristor is switched on by injecting a current into its gate-cathode junction. In a series string of thyristors supporting a large voltage at the time of switching, all thyristors must conduct simultaneously to prevent overvoltage destruction of the slower thyristors.

Thyristor activation is commonly achieved with a voltage isolation transformer with a winding operating on the high-voltage side of the power electronic device. The current gate drive signal is then produced with a resistor positioned between the thyristors and the secondary side of the voltage isolation transformer. There are a number of problems with this voltage source gate drive arrangement. First, it is difficult to obtain uniform gate pulses at each thyristor because of the normal variations in thyristor gate impedances, and because one or more thyristors may fail, thereby resulting in a shorted gate. Second, the magnitude and other parameters of voltage-sourced pulse trains are controlled at the high voltage-side of the system. Consequently, each thyristor may require costly and complicated equipment such as a power supply, inverter, and feedback loop for current control. Third, isolation of the high-voltage thyristor circuit from the low voltage control circuit is costly and bulky. It would be highly desirable to develop a thyristor gate drive device that provides uniform gate pulses, regardless of variations in thyristor impedance or the presence of failed thyristors. It would also be desirable to develop a thyristor gate drive device that operates at low voltage and thereby eliminates the requirement for costly and complicated high-voltage side control devices. Naturally, if a low voltage-side thyristor gate drive device is to be used, it should have a simple and inexpensive isolation mechanism from the high-voltage side of the power conditioning apparatus.

Current pulse shaping circuits for thyristors are activated with edge-triggered logic. Edge-triggered logic is susceptible to activation by noise spikes, cross-talk, and other transients. If an edge-triggered logic device erroneously fires a thyristor, a large differential voltage may exist across the switch at the point of firing. For instance, in the case of a thyristor switched capacitor, the capacitor may be negatively charged to the negative-peak line voltage and then be switched on during the positive-peak line voltage. In this case, the capacitor will encounter a rapid voltage change. This results in extremely high currents which can damage the thyristors and the capacitor.

In addition to the problem of high current due to misfiring, the inductance of the power line and the capacitance from the capacitor form an LC circuit with a step input of twice the peak line voltage. The capacitor will therefore encounter peak voltages of up to 3 times the nominal peak line voltage, which can eventually cause the capacitor itself to fail. Since failed capacitors tend to form short circuits, the associated thyristors may then have to interrupt the full fault current of the line, which can destroy the thyristors.

The problem of false triggering of edge-triggered logic has previously been addressed with shielding of critical signal lines and by minimizing imperfections in grounding. Unfortunately, these efforts have only incrementally improved the false firing problem and thereby have not substantially eliminated the phenomenon. Therefore, it would be highly desirable to provide a technique for eliminating the problem of false thyristor gate firing signals.

SUMMARY OF THE INVENTION

A current source gate drive circuit for simultaneous firing of a set of series or parallel thyristors is described. The circuit includes two current loops, each of which serves as a current transformer primary. Electrically insulating tubes enclose the current loops. Current transformer cores, around which are wound a certain number of secondary turns, surround the current loops, thus magnetically coupling the primary current of the current transformer to the secondary turns. Thyristor gate driver circuits are electrically coupled to the current transformer cores. Each of the thyristor gate driver circuits receives and rectifies ac current signals from the current loops and forms a current pulse train firing signal. Each thyristor gate driver circuit has a corresponding thyristor that is fired by the current pulse train firing signal. The thyristors operate at a high voltage, but are electrically isolated from the current loops by the insulating tubes. A current pulse shaping circuit is connected to the current loops and uses dual resonant LC circuits to generate ac current signals. The current pulse shaping circuit operates in a low voltage region and is electrically isolated from the high voltage region by the insulating tubes. The current pulse shaping circuit is activated by an edge-triggered signal. To prevent misfiring of the thyristors, thyristor firing command logic is used to generate a level-trigger signal. Level-triggered logic is responsive to the level-trigger signal, but not noise or transients, and produces a pulse train enable signal that allows the thyristors to be fired.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
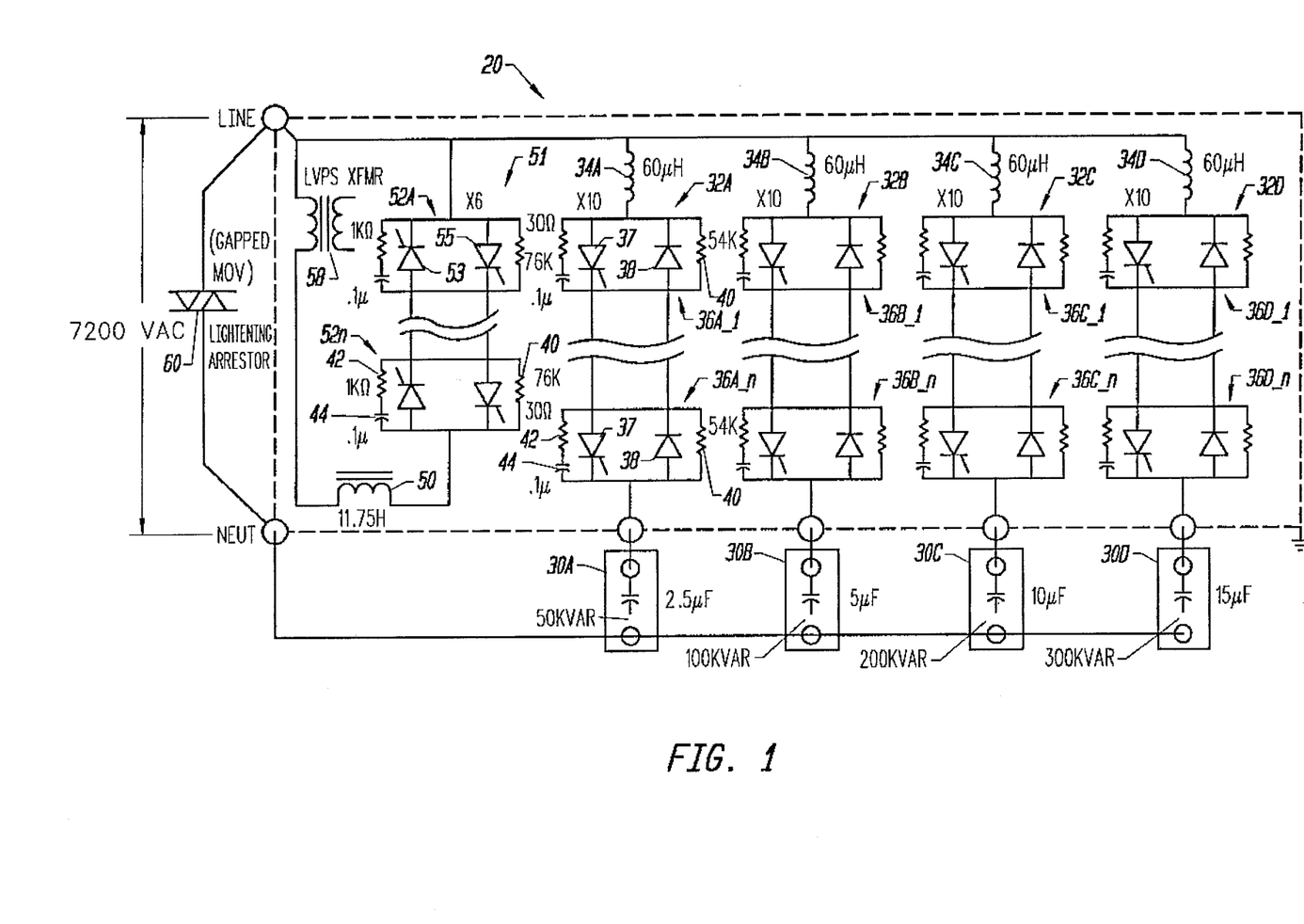
FIG. 1 illustrates a static VAR compensator that may incorporate the techniques of the present invention.

FIG. 1 illustrates a static VAR compensator 20 that may successfully utilize the current source gate drive circuit of the invention. The invention will be disclosed in relation to the static VAR compensator of FIG. 1, however, it will be appreciated that the invention is applicable to any power conditioning device that uses multiple semiconductor devices.

Multiple semiconductor devices are frequently necessitated in power electronics where switching is required at voltages beyond the rating of individual semiconductors. In this case, the semiconductors are stacked to achieve the required voltage blocking capability.

A static VAR compensator (SVC) is used to switch capacitors on line or to phase-angle-fire a reactor across the line, thereby controlling either the displacement power factor upstream of the SVC or the line voltage at the SVC. FIG. 1 illustrates a number of compensating capacitors 30A, 30B, 30C, and 30D of an SVC. Series thyristor strings 32A, 32B, 32C, and 32D are used to switch the respective compensating capacitors. Preferably, each series thyristor string 32 includes an isolating inductor 34, to limit in-rush current.

Each series thyristor string 32 includes a number of opposing thyristor-diode pairs 36A_1 through 36A_N. Each opposing thyristor-diode pair 36 includes a thyristor 37 in an opposing parallel relation with a diode 38. The diodes 38 allow the charging capacitors 30 to negatively charge each cycle. Preferably, each opposing thyristor-diode pair 36 includes a current leakage resistor 40 in a parallel branch and a snubber branch resistor 42 and a snubber branch capacitor 44 in another parallel branch. The voltage balance resistors 40 compensate for the variation in semiconductor leakage currents so that each thyristor-diode pair in the string will support a nearly equal share of the system voltage. The snubber branch resistor 42 and the snubber branch capacitor 44 are used to process the inherent recovered charge of a thyristor and thereby insure that all thyristors 53 of a thyristor string 32 shut off at the same time.

The static VAR compensator 20 may also include a compensating reactor 50 that has a corresponding thyristor string 51. The thyristor string 51 includes a number of opposing thyristor pairs 52A through 52N. Each opposing thyristor pair includes a first thyristor 53 and an opposing parallel thyristor 55. The static VAR compensator 20 may also include step-down voltage transformer 58 to supply control power and for line voltage sampling. A lightning arrestor 60 is also shown.

Figure 2:
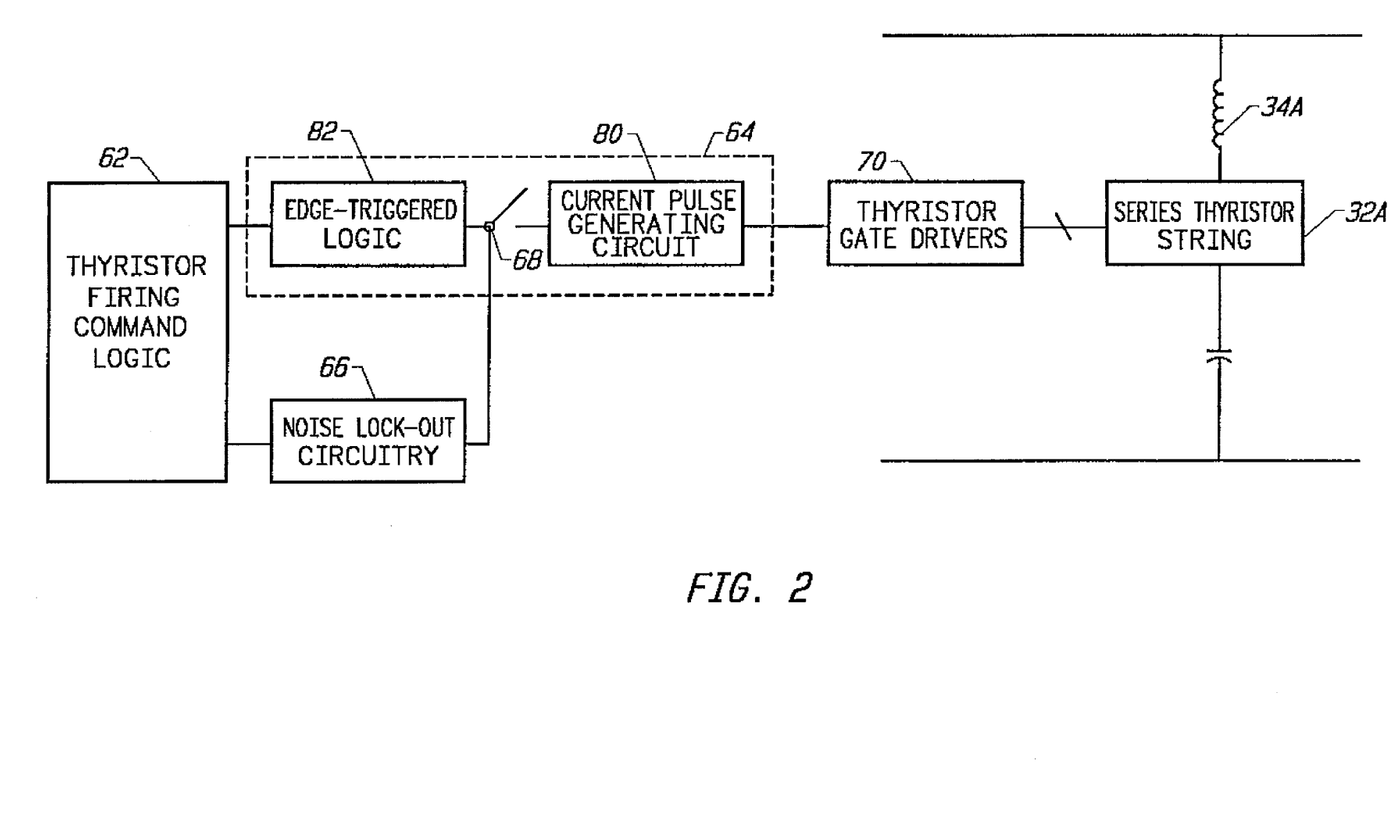
FIG. 2 illustrates the components of the invention and their relationship to a series thyristor string of the static VAR compensator of FIG. 1.

FIG. 2 illustrates some of the main components associated with the present invention and their relation to a series thyristor string of the type shown in FIG. 1. The figure depicts a series thyristor string 32A and its associated compensating capacitor 30A and isolating inductor 34A. A prior art device for firing the series thyristor string 32A would include pulse shaping circuitry which is triggered by some type of thyristor firing logic. The thyristor firing command logic 62 of the present invention generates two thyristor firing command signals. As will be described below, this novel technique is used to prevent false firing of the series thyristor string. The decision of when to fire the thyristors may be based upon a conventional zero voltage crossing control scheme or a related scheme.

The thyristor firing command logic 62 generates an edge-trigger signal that is applied to the current pulse shaping circuitry 64 of the invention. As its name implies, the current pulse shaping circuitry 64 generates a current pulse train for the series thyristor string 32A. The current pulse shaping circuitry 64 includes edge-triggered logic 82 and current pulse generating circuitry 80. The thyristor firing command logic 62 also generates a level-trigger signal that is applied to the noise lock-out circuitry 66 of the invention. As will be described below, the noise lock-out circuitry 66 will close a switch 68 only when a valid level-trigger signal is received. In this case, the signals from the edge-triggered logic 82 are allowed to pass to the current pulse generating circuitry 80, and onto the series thyristor string 32A. Thus, the edge-triggered logic 82 of the current pulse shaping circuitry 64 will not falsely fire the series thyristor string 32A in response to noise signals typically found in power systems. The noise lock-out circuitry 66 will be further discussed below. Attention presently turns to the current pulse shaping circuitry 64 of the invention.

Figure 3:
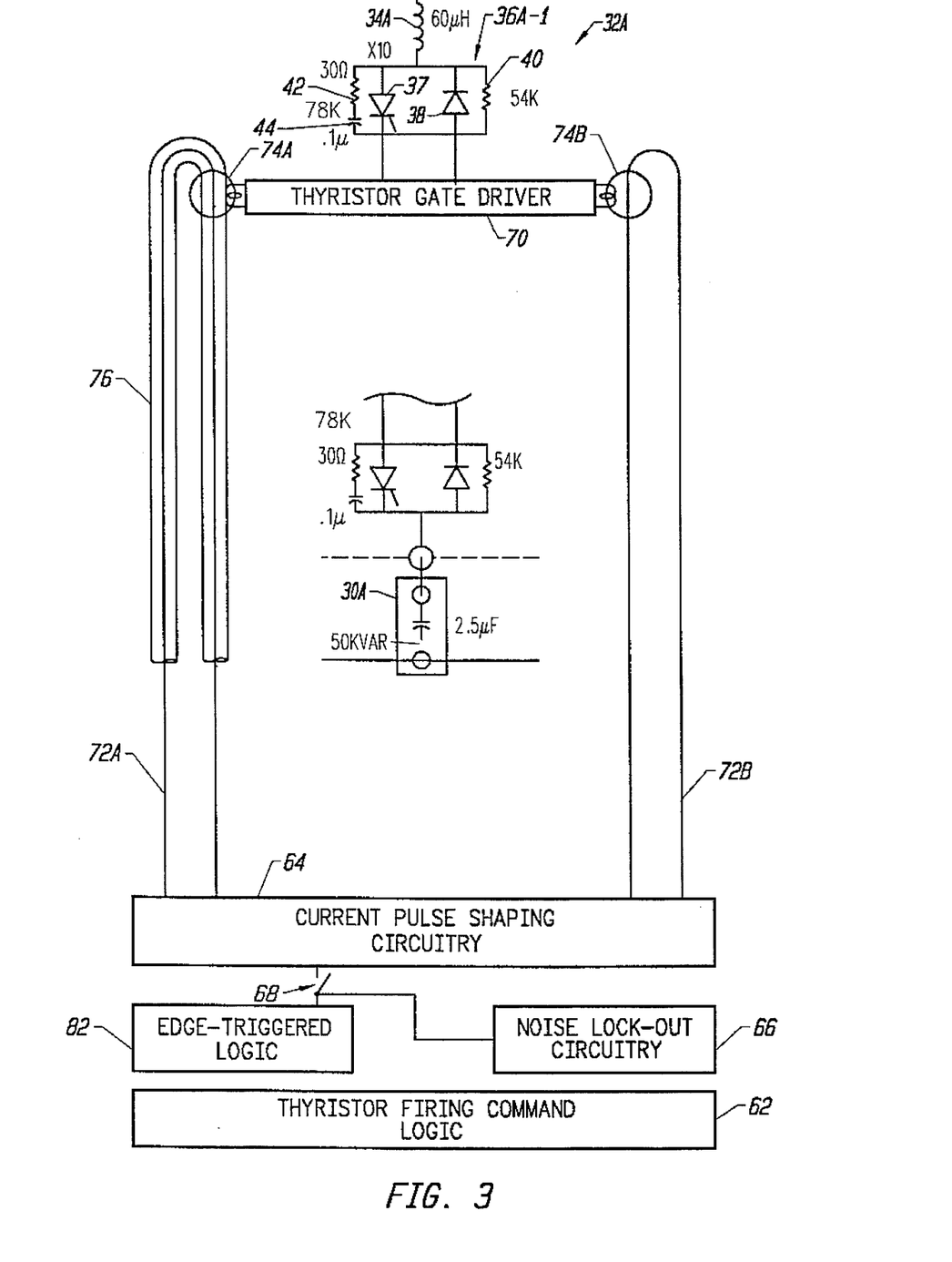
FIG. 3 is a more detailed depiction of the relationship of the components of the invention to a series thyristor string of the static VAR compensator of FIG. 1.

FIG. 3 illustrates a series thyristor string 32A and its relationship to the current pulse shaping circuitry 64 of the invention. The current pulse shaping circuitry 64 of the invention is a dual resonant current generator. The current pulse shaping circuitry 64 generates a first pulse current pulse train on current loop 72A and a second half-cycle shifted current pulse train on current loop 72B. Each current loop serves as a single primary turn of a current transformer. Each current loop 72 is placed within a dielectric tube 76, such as plastic, that runs through the center hole of a set of current transformer cores 74 associated with each opposing thyristor-diode pair 36 of the thyristor string 32A. (The connections to the other opposing thyristor-diode pairs 36 of the thyristor string 32A are omitted for the sake of simplicity). Each current transformer core 74 has an associated secondary winding coupled to the thyristor gate driver 70 to reduce the primary current to a rated gate current value. The thyristor gate driver 70 combines and rectifies the signals from the two current loops 72A and 72B to form a current pulse train firing signal for the opposing thyristor-diode pair 36.

A few key aspects of the disclosed technology should be noted at this time. First, a true current source pulse stream is provided, thus variations in thyristor impedance will not disrupt firing of the thyristors. In addition, a shorted thyristor will not result in serious damages to the other thyristors, as would be the case with a voltage sourced current pulse stream. Next, the current pulse shaping circuitry 64 operates at a low-voltage side of the power conditioning device with simple isolation between the low-voltage current pulse shaping circuitry 64 and the high-voltage thyristor string 32A. Thus, typical bulky and expensive transformer isolation between the power system voltage and the gate control circuitry is obviated. Similarly, there is no problem from electrical magnetic noise on the power system being coupled to the low voltage controls through a voltage pulse transformer. As a result, the likelihood of thyristor mis-firing is diminished. It should also be noted that expensive fiber optic equipment is not required.

Figure 4:
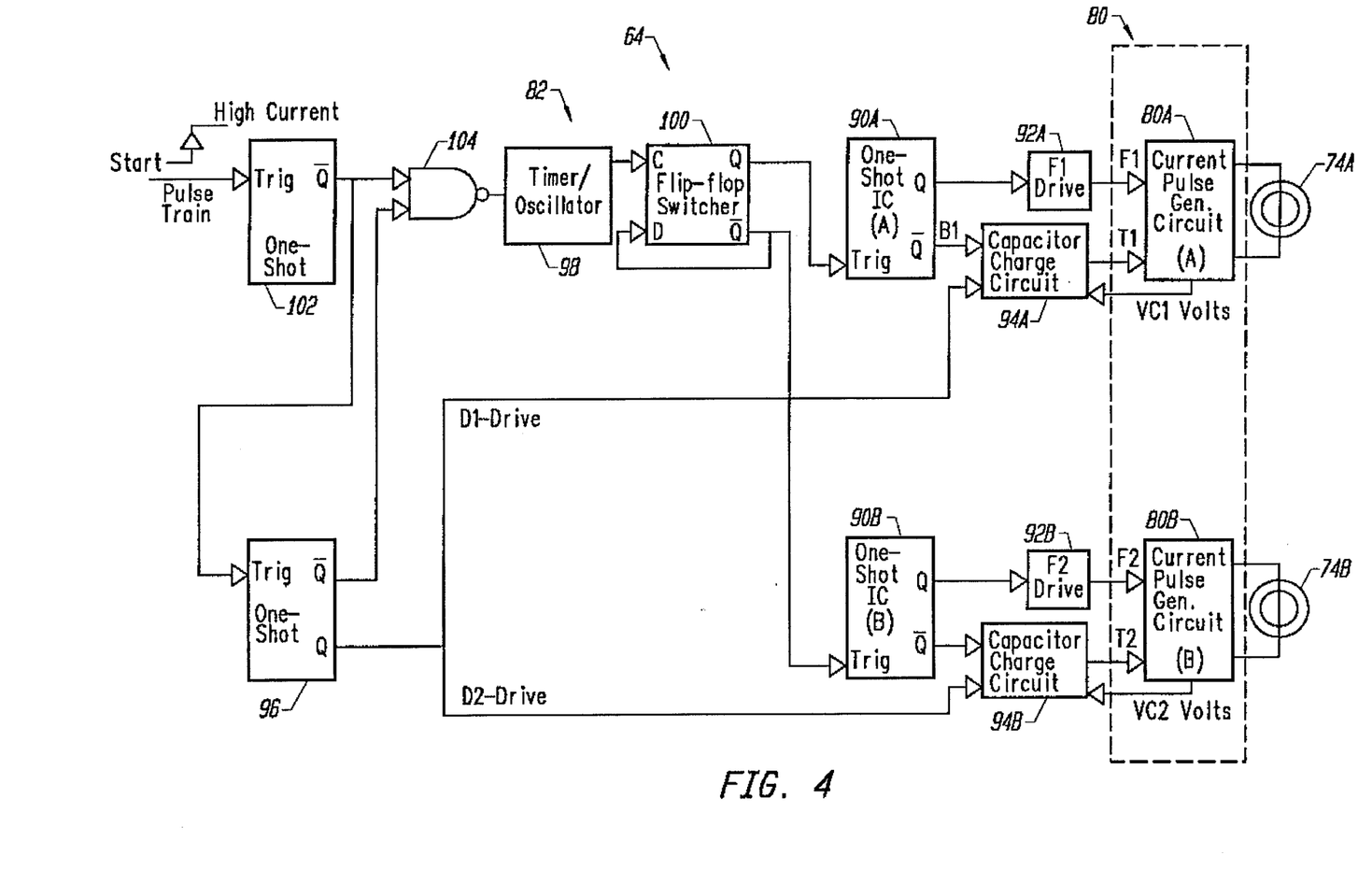
FIG. 4 illustrates the current pulse shaping circuitry of the present invention.

FIG. 4 illustrates the current pulse shaping circuitry 64 of the invention, which includes current pulse generating circuitry 80 and edge-triggered logic 82. Attention initially turns to the current pulse generating circuitry 80.

Figure 5:
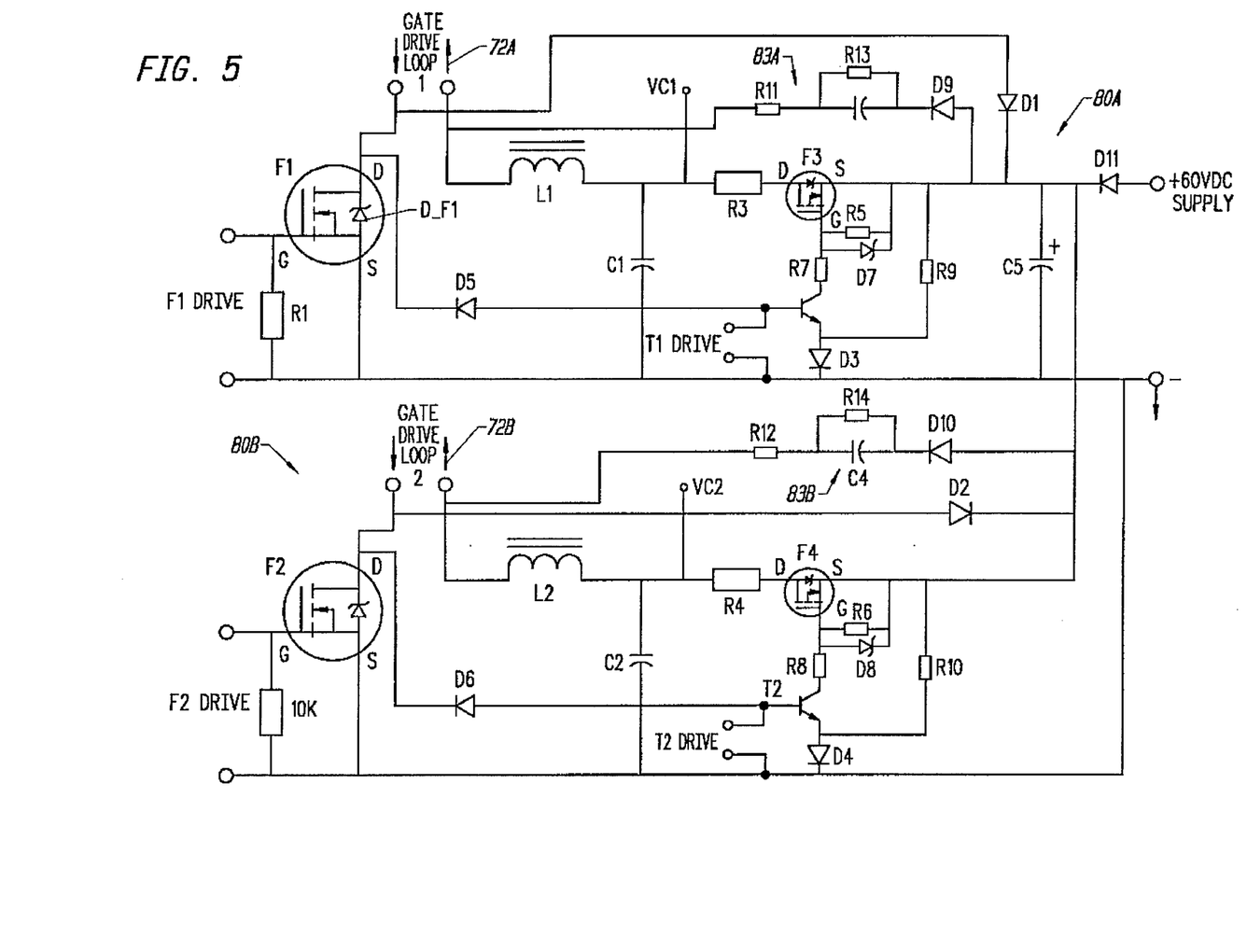
FIG. 5 shows the current pulse generating circuitry of the invention.

FIG. 5 illustrates that the current pulse generating circuitry 80 includes a current pulse generating circuit 80A and current pulse generating circuit 80B. Both circuits are identical and share a common storage capacitor C5. In current pulse generating circuit 80A, capacitor C1 and inductor L1 comprise a resonant LC circuit. Field Effect Transistor (FET) F1 completes the current loop for the resonant circuit each time it is gated on. FET F3 replenishes the charge on capacitor C1 each time transistor T1 is switched on. Resistor R3 limits the initial current when F3 conducts. Diode D5 shunts the base drive of T1 and prevents the charging of C1 when either F1 or its internal diode D_F1 is conducting. Diode D1 clamps the maximum voltage of the drain terminal of F1 to the supply voltage.

Figure 6:
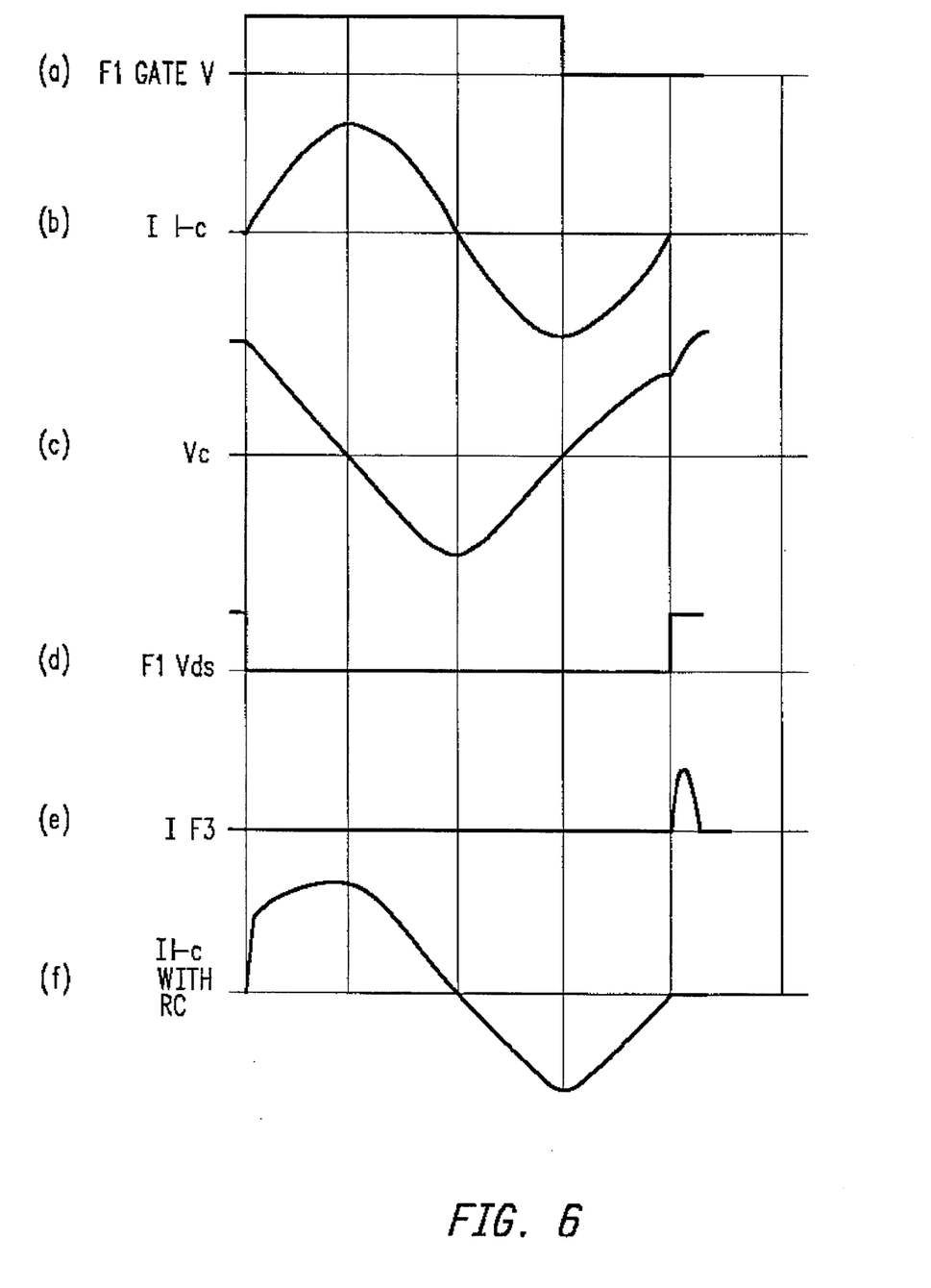
FIG. 6 depicts control signals and waveforms formed in accordance with the current pulse generating circuitry of FIG. 5.

Assume that capacitor C1 is fully charged to a positive voltage and the gate drive loop terminals are shorted together through current loop 72A. When F1 is gated ON, capacitor C1 discharges through L1, the current loop 72A, the F1 drain-source terminals and back to the negative terminal of C1. The current flows in a resonant manner. The activation of the gate of F1 is shown in FIG. 6(a). FIG. 6(b) shows the resultant resonant current.

Capacitor C1 then charges to a maximum negative voltage as the LC current reaches zero as seen in FIG. 6(c). The negative voltage on C1 causes the current to reverse direction. The current now flows through the reverse diode D_F1, the current loop 72A, L1 and the positive side of C1. The F1 gate drive may be removed at any time during the negative current period and the resonant cycle will be completed as shown in FIGS. 6(a) and 6(b). The voltage on C1 does not return to the original voltage due to losses in the resonant loop, current transformers and thyristor gate circuits. When the resonant current becomes zero, F1 retains a blocking state, as shown in FIG. 6(d).

To restore C1 to the original voltage value existing before the voltage drops of the resonant loop, the capacitor is re-charged when the resonant current is zero. At this time, transistor T1 is gated ON. F3 is then gated ON to provide a pulse of current to quickly charge C1 to the initial voltage. This operation is shown in FIGS. 6(c) and 6(e). At this point, the circuit is ready to generate another current pulse when F1 is gated ON in the manner previously described.

To ensure that all thyristors in the series string conduct within a given time period, it is often necessary to provide an initial gate pulse with a leading edge within the given time period. Thus it is desirable to include a steep-rise RC circuit 83 in the current pulse generating circuitry 80 of the invention. The steep-rise RC circuit 83A includes resistors R11 and R13, capacitor C3 and diode D9. When F1 is gated ON, capacitor C3 rapidly charges through resistor R11, the current loop 72A, transistor F1 to the negative side of the input capacitor C5. The risetime of the current spike is basically limited by R11 and the impedance of the current loop. This current spike is added to the leading edge of the first current pulse generated by each current generator circuit. Thus, the waveshape of the first sinusoidal current pulse applied to each input of the thyristor gate drive circuit is modified to have a steep front edge, as shown in FIG. 6(f). The first sinusoidal current pulse from current pulse generating circuitry 80B will have the same steep front edge. Preferably, the steep front edge rises to about 0.7 amps of secondary current in 0.5 microseconds. The discharge time constant (C3, R13) is set for several milliseconds to ensure that only one fast rising pulse is developed by each generator during each pulse train.

Current pulse generating circuitry 80b operates in the same manner as current pulse generating circuitry 80a, except that the firing of F2 is shifted 180 degrees from the firing of F1. Thus, the positive current half cycle of current pulse generating circuitry 80B occurs during the negative current half cycle of current pulse generating circuitry 80A, and vice versa. The positive half cycle of each current loop is applied to the gate input terminal of each thyristor in the series/parallel string.

Figure 7:
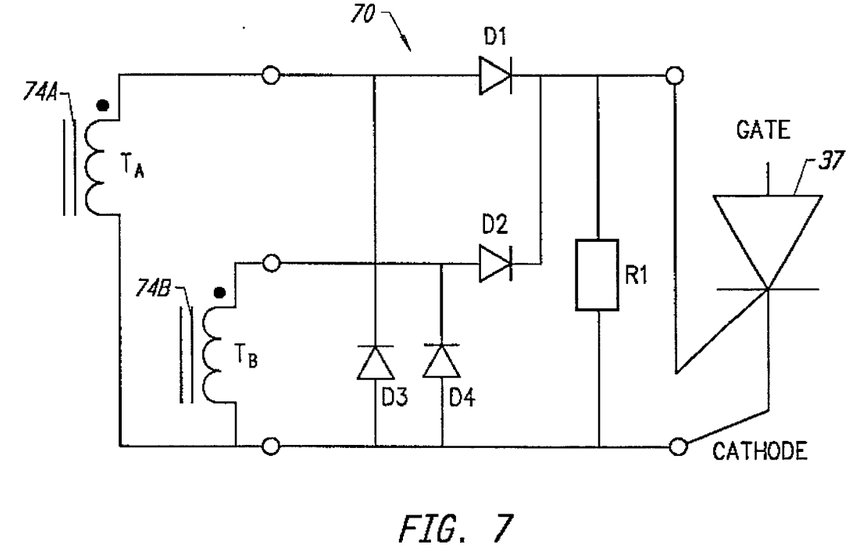
FIG. 7 illustrates a thyristor gate driver that may be used in accordance with the invention.

The currents are directed to the gate terminal by a thyristor gate driver 70, shown in FIG. 7. Note that the unused negative half cycle currents are shorted by diodes D3 and D4 to minimize power losses supplied by the current generator. The shorted negative half cycle current in one current loop is replaced by a full positive half cycle current from the other current loop. Thus, a train of equal positive current pulses is applied to the thyristor gate terminal, as shown in FIG. 9(m).

The operation of the current pulse generating circuitry 80 is controlled by edge-triggered logic 82, shown in FIG. 4. Transistor F1 of the current pulse generating circuitry 80A is gated by a driver circuit for a period set by a one-shot IC (monostable multivibrator integrated circuit) 90A. Each time the one-shot IC 90A is triggered, the Q output voltage switches high for roughly ¾ of the resonant period, gating the F1 driver 92A. At the completion of the F1 drive period, the Q output switches low as the Q– output (signal B1) goes high to enable the capacitor charge circuit 94A.

Figure 8:
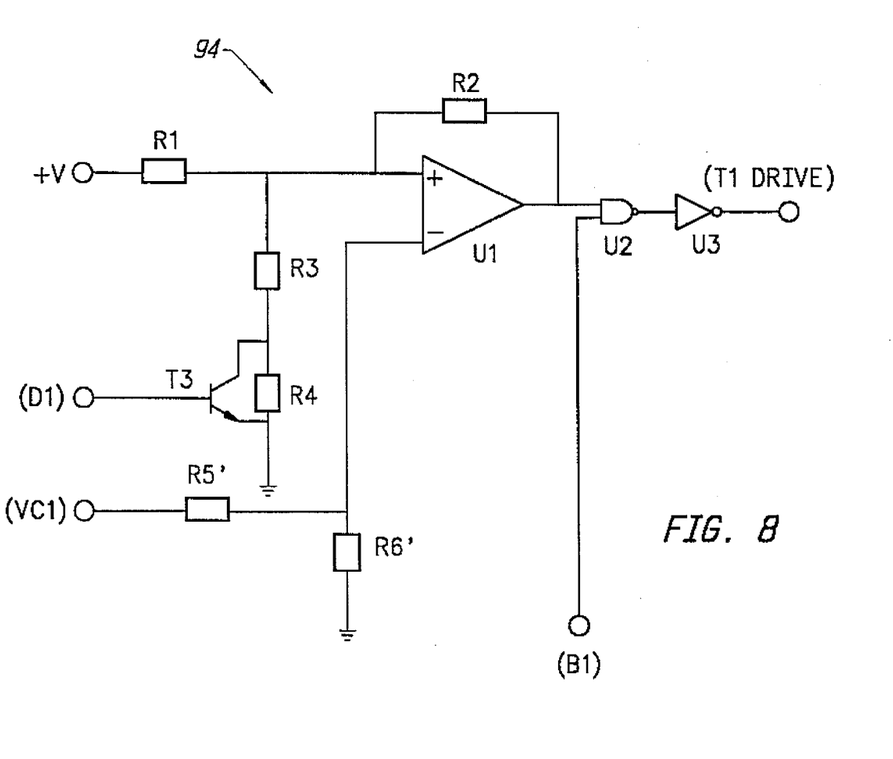
FIG. 8 shows the capacitor charge circuit of the invention.

The capacitor charge circuit 94A is shown in FIG. 8. The capacitor charging circuit quickly restores the initial voltage level at the end of each cycle generated by the current-source circuits. The purpose of this circuit is to quickly charge the capacitor C1 to a voltage reference level established at the positive (+) terminal of comparator U1. The voltage across C1 is applied to the negative (–) terminal through the voltage divider of R5' and R6'. The output of U1 will switch to a logic one (positive) when the reference voltage is greater than the capacitor feedback voltage VC1. If the NAND gate U2 is enabled by signal B1, the output of U2 will be logical zero and the output of U3 will be logical one. The output of U3 thereby serves as the base drive to transistor T1 of the current pulse generating circuitry 80A, causing F3 to conduct and C1 to charge to the reference voltage.

The capacitor charge circuit 94A of FIG. 8 includes transistor T3 which is used to modulate the voltage reference input to comparator U1. That is, transistor T3 may be turned on to reduce the voltage reference signal to the comparator U1 when a smaller gate pulse is desired. The base drive to T3 is signal D1 that is developed by low current one-shot circuit 96. When the Q output of the low current one-shot circuit 96 goes to a logical one for a selected time, T3 is switched on and reduces the peak gate drive current reference to V1 for that period. As a result, the feedback signal VC1 needed to switch off the T1 drive signal is reduced and the capacitor C1 is charged to a lower voltage. Consequently, the generated current pulse train signal has a diminished amplitude.

The remaining elements of the edge triggered logic 82 control the duration of the gate drive pulse train. These elements include standard low cost integrated circuits that precisely control the timer frequency, phase shift, charging time, periods of current level changes and the initiation and duration of the current pulse train. The oscillator 98 and the flip-flop switcher 100 establish the phasing between the two current pulse generating circuits 80A and 80B. The Q and Q− outputs of the flip-flop switcher 100 change state each time the clock input receives a pulse from the oscillator 98. The oscillator 98 frequency is set to slightly less than twice the LC resonant frequency of the pulse generator circuits to provide a few microseconds of charging time for C1 and C2.

The initiation and duration of the gate drive pulse train is established by high current one-shot circuit 102 and low current one-shot circuit 96. The high current one-shot circuit 102 receives a gate signal from thyristor firing command logic 62. The gate signal at the high current one-shot circuit 102 makes the Q− output low, thereby driving the NAND gate 104 high to activate the input to the oscillator 98. This initiates a train of gate pulses. At the end of the high current period, Q− goes high and triggers the low current one-shot circuit 96. The Q− output of the low current one-shot circuit 96 goes low and continues to enable the oscillator 98. The Q output switches high, turning on transistor T3 of the capacitor charge circuit 94A. This changes the reference voltage to the comparator U1 low.

When the low current one-shot circuit 96 times out, the oscillator 98 stops and the gate pulses are terminated until the thyristor firing command logic 62 generates another pulse for high current one shot circuit 102. During this period, the Q output of the low current one-shot circuit 96 is zero and the capacitor charge circuits 94A and 94B maintain the voltage on C1 and C2 to a high value. This insures that the first pulses of the next drive train have a high value.

Figure 9:
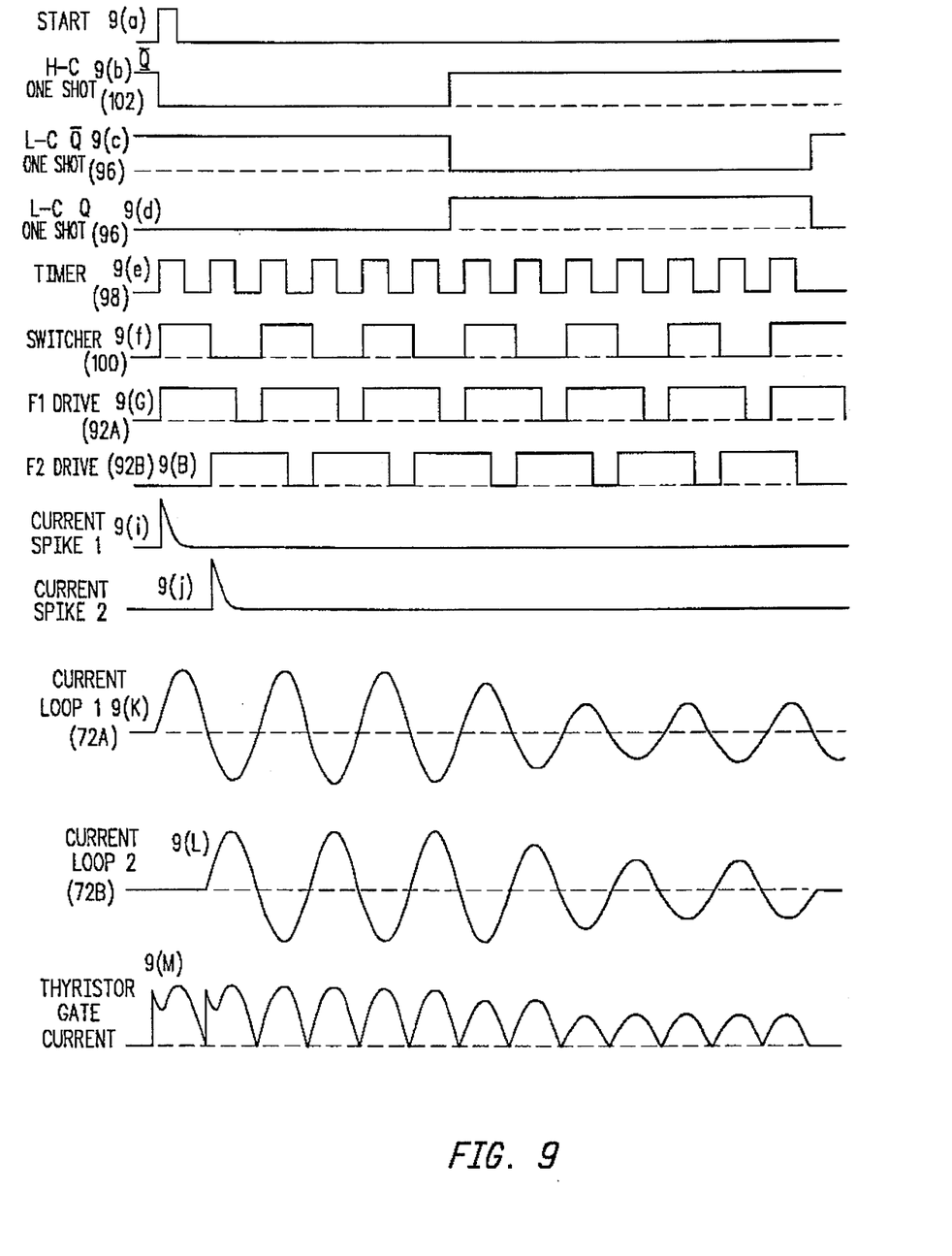
FIG. 9 illustrates timing signals and waveforms associated with the current pulse generating circuitry of the invention.

The foregoing description of the current pulse shaping circuitry 64 of the invention is more fully appreciated with reference to the timing diagrams of FIG. 9. The timing diagram 9(a) illustrates a start pulse that is initiated by the thyristor firing command logic 62. This signal drives the high current one-shot circuitry 102 low, as shown in FIG. 9(b). This action initiates the oscillator 98, as shown in FIG. 9(e) and the switcher 100, as shown in FIG. 9(f). In turn, the switcher 100 initiates the one-shot IC 90A and the F1 drive 92A, as shown in FIG. 9(g). A half cycle later, the switcher 100 initiates the one-shot IC 90B and the F2 drive 92B, as shown in FIG. 9(h).

FIG. 9(i) illustrates the current spike produced by the RC circuit 83A, while FIG. 9(j) illustrates a half-cycle shifted current spike produced by the RC circuit 83B. FIG. 9(k) depicts the current pulse train generated in current loop 72A, while FIG. 9(l) depicts the half-cycle shifted current pulse train generated in current loop 72B. FIG. 9(m) illustrates the composite current pulse train firing signal. The rectified signals of FIGS. 9(k) and 9(l) form the signal of FIG. 9(m). Note that the first two pulses of the composite current pulse train gate drive signal of FIG. 9(m) have steep leading edges (steep rises) as a result of the current spikes shown in FIGS. 9(i) and 9(j).

FIG. 9(m) illustrates that the amplitude of the current pulse train firing signal falls off after the initial pulses. This trait is desirable to insure nearly instantaneous turn-on of all thyristors followed by a lower level of drive to reduce losses. The fall in amplitude of the signal corresponds to the activation of the low current one-shot Q output signal shown in FIG. 9(d). As previously described, this signal forms a gate drive for transistor T3 of FIG. 8. The transistor therefore turns on and pulls down the voltage level of the reference voltage into the positive terminal of comparator U1. Thus, a reduced value of capacitor feedback voltage is needed to equal the reference voltage and switch off the T1 charge signal. This results in a current pulse train signal with a diminished amplitude.

The edge-triggered logic 82 of FIG. 4 includes edge-triggered elements that are highly susceptible to false triggering from various transients. When the edge-triggered logic is triggered by noise it activates that current pulse generating circuitry 80. Ultimately, the thyristors are fired in response to a false signal. As indicated in the background section, this can result in the destruction of the thyristors. To avoid this problem, the apparatus of the present invention includes noise lock-out circuitry 66.

Figure 10:
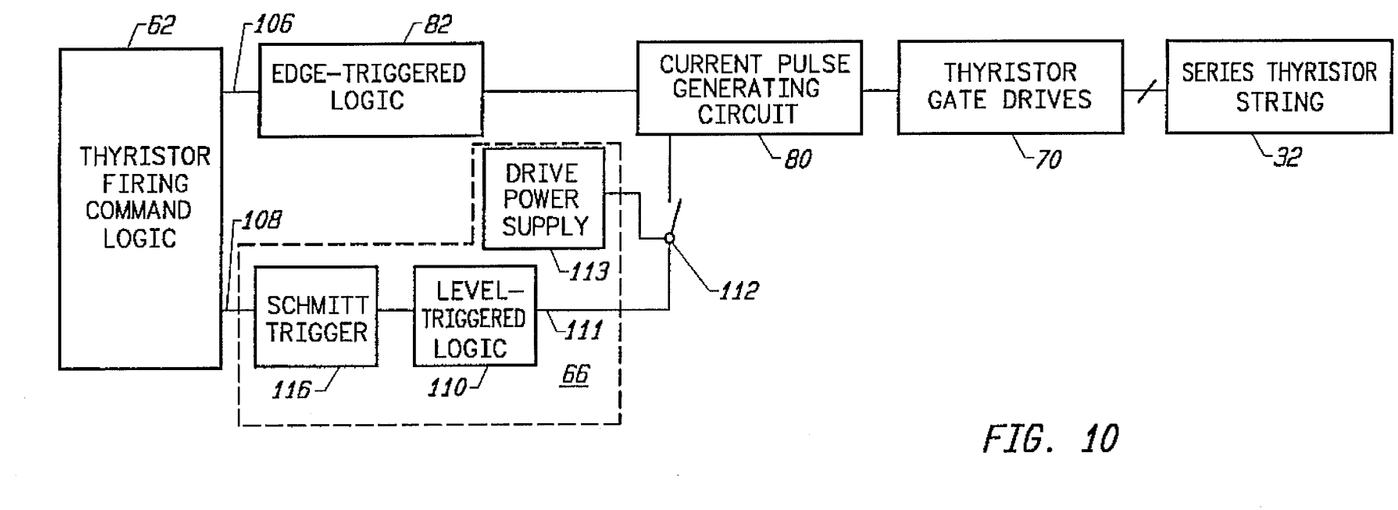
FIG. 10 shows the relation of the noise lock-out circuitry to the other elements of the invention.

FIG. 10 depicts the relation of the noise-lock circuitry 66 of the invention to the other elements of the invention. By way of overview, the noise-lock circuitry 66 of the invention operates in the following manner. The output of the previously described edge-triggered logic 82 is only allowed to reach the current pulse generating circuit 80 if the noise-lock circuitry 66 is enabled. This event occurs only if the thyristor firing command logic 62 generates two valid signals. The first, an edge-trigger signal used by edge-triggered logic 82, and the second a level-trigger signal with a duration sufficient to activate the level-triggered logic. Since a noise spike or other transient which would trigger the edge-triggered logic 82 is insufficient to activate the level-triggered logic of the invention, the edge-triggered logic 82 prevents the noise spike or other transient from generating a pulse stream to the series thyristor string at the wrong instance.

The thyristor firing command logic 62 generates a signal on the edge-triggered logic line 106 of the edge-triggered logic 64 and a signal on the noise lock-out line 108 of the noise lock-out circuitry 66. Typically, the thyristor firing command logic 62 will be in the form of a microprocessor executing appropriate software. The software will generate thyristor firing commands based upon a control strategy, such as only firing the thyristors when the line voltage is within 10% of the compensating capacitor voltage, a zero voltage crossing scheme, or the like. In any event, the noise lock-out circuitry 66 includes level-triggered logic 110. The level triggered logic 110 is not activated by an edge, rather it is only activated by a sustained signal and only operates during the duration of the signal. Therefore, a noise spike or other typical transient would not activate the level triggered logic 110. The level-triggered logic 110 may be implemented as serial inverters. The serial inverters also serve to boost the computer signal sufficiently to drive a switch.

When a valid activation command is generated by the thyristor firing command logic 62, the level-triggered logic 110 generates an output signal on line 111 which is used to close switch 112. When switch 112 is closed, the drive power supply 113 (say a 12V dc power supply) provides drive power for the current pulse generating circuit 80. The drive power supply 113 allows the current pulse generating circuitry 80 to produce its output on 72A and 72B for the thyristor gate drives 70.

The noise lock-out circuitry 66 of the invention optionally includes a Schmitt Trigger 116 with a low-pass filter. The low-pass filter may be implemented as an RC circuit with a time constant set in accordance with the largest expected noise pulse width.

Figure 11:
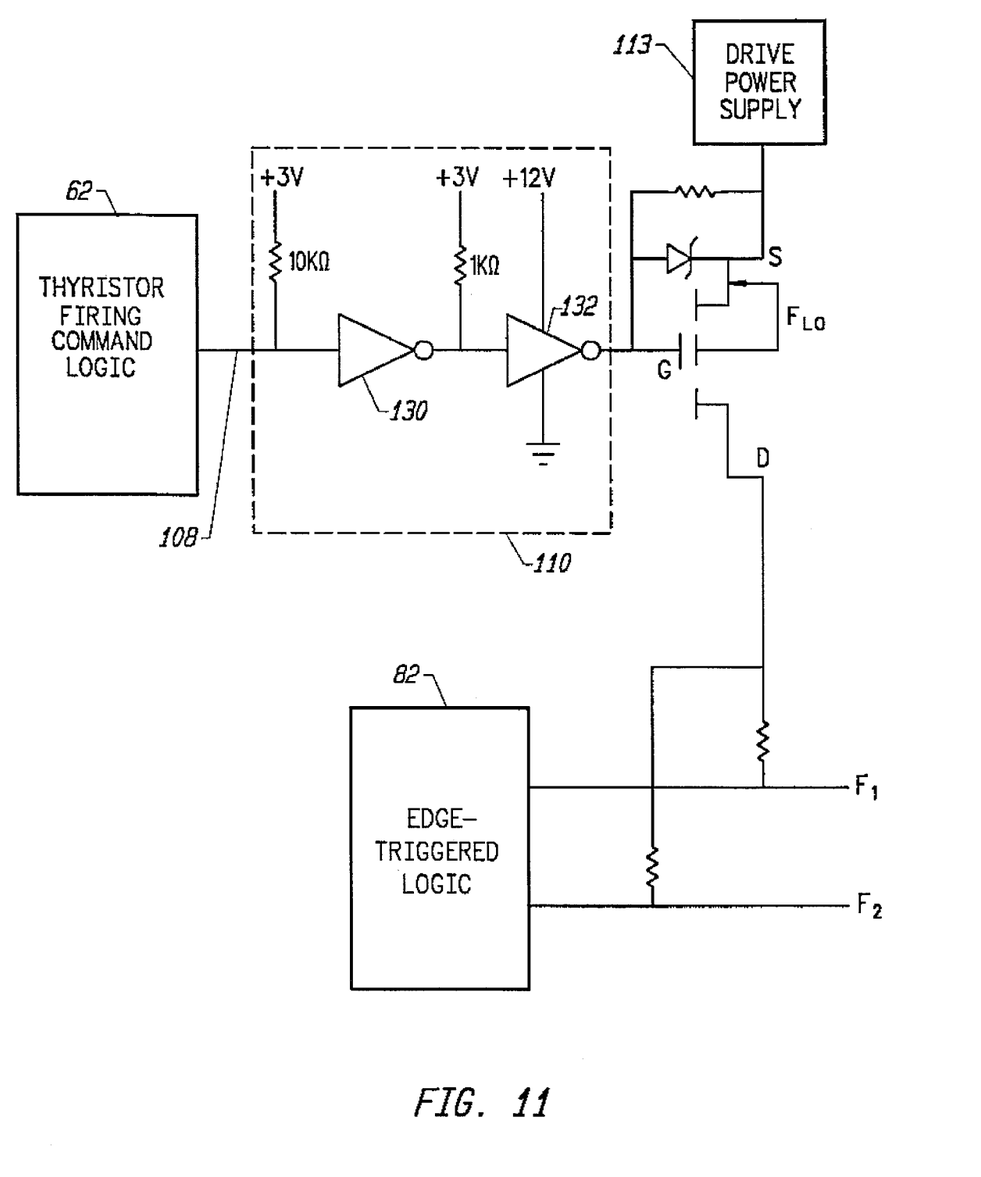
FIG. 11 illustrates the details of one embodiment of the level-triggered logic circuitry of the invention.

FIG. 11 illustrates an embodiment of the level-triggered logic 110 of the invention. In this embodiment, an active low signal from the thyristor firing command logic 62 is applied to level-triggered logic line 108. Since the computer signal is not suitable for driving a FET directly, an inverting peripheral driver integrated circuit is used comprising inverters 130 and 132. The output of the inverters of the level-triggered logic is used to turn-on the active low gate of lock-out FET LO. When active, FET LO allows the drive power from the drive power supply 113 to reach the current pulse generating circuit 80. If this drive power is not present, then the open collector outputs of the edge-triggered logic 82 cannot be pulled up to a level sufficient to drive switch 112 into the on state. Thus, in this embodiment of the invention, switch 112 is implemented as FET LO, which initiates operation of the current pulse train.

Thus, it will be appreciated that the present invention describes a thyristor gate drive device that provides uniform gate current pulses, regardless of variations in thyristor impedance or the presence of failed thyristors. The invention also provides a thyristor gate drive device that operates at low voltage and thereby eliminates the requirement for costly and complicated high-voltage side control devices. Furthermore, the low voltage-side thyristor gate drive circuitry of the invention is isolated from the high-voltage side of the device with a simple and inexpensive isolation mechanism. The disclosed invention also provides a technique for eliminating the problem of false thyristor gate firing signals.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A current source gate drive circuit for simultaneously firing a set of thyristors, comprising:

a first current loop serving as a first current transformer primary and carrying a first current pulse train with a first phase;

a second current loop serving as a second current transformer primary and carrying a second current pulse train with a second phase shifted a half-cycle from said first phase;

a first electrically insulating tube enclosing said first current loop;

a second electrically insulating tube enclosing said second current loop;

a first plurality of current transformer cores surrounding said first current loop;

a second plurality of current transformer cores surrounding said second current loop;

a plurality of thyristor gate drivers, each of said thyristor gate drivers including a first current transformer secondary winding being coupled to one of said first plurality of current transformer cores, and a second current transformer secondary winding being coupled to one of said second plurality of current transformer cores, each of said thyristor gate drivers thereby receiving said first current pulse train and said second current pulse train, each of said thyristor gate drivers rectifying said first current pulse train and said second current pulse train to form a current pulse train firing signal;

a plurality of thyristors, each of said thyristors being coupled to a selected thyristor gate driver of said plurality of thyristor gate drivers and thereby receiving said current pulse train firing signal, said plurality of thyristors operating in a high voltage region and being electrically isolated from said first current loop and said second current loop by said first insulating tube and said second insulating tube; and a current pulse shaping circuit connected to said first current loop and said second current loop to generate said first current train and said second current pulse train, said current pulse shaping circuit operating in a low voltage region and being electrically isolated from said high voltage region by said first insulating tube and said second insulating tube, said current pulse shaping circuit including a first current pulse generating circuit coupled to said first current loop and including an LC network for generating said first current pulse train, and a second current pulse generating circuit coupled to said second current loop and including an LC network for generating said second current pulse train.

2. The current source gate drive circuit of claim 1 wherein said first current pulse generating circuit includes a first capacitor charge circuit and said second current pulse generating circuit includes a second capacitor charge circuit.

3. The current source gate drive circuit of claim 2 wherein said first capacitor charge circuit and said second capacitor charge circuit each include a comparator for comparing a voltage reference signal and a capacitor reference signal to produce a capacitor recharge signal.

4. The current source gate drive circuit of claim 3 wherein said voltage reference signal is modulated to produce a diminished amplitude capacitor re-charge signal that produces a diminished amplitude in said first current pulse train and said second current pulse train.

5. The current source gate drive circuit of claim 4 wherein said first current pulse generating circuit includes a first steep-rise RC circuit for creating a steep rise on the first pulse of said first current pulse train and said second current pulse generating circuit includes a second steep-rise RC circuit for creating a steep rise on the first pulse of said second current pulse train.

6. The current source gate drive circuit of claim 1 further comprising thyristor firing command logic to generate an edge trigger signal for said current pulse shaping circuit and a level-trigger signal for a noise lock-out circuit.

7. The current source gate drive circuit of claim 6 wherein said noise lock-out circuit includes level-triggered logic to generate a pulse train enable signal only in response to said level-trigger signal, said pulse train enable signal enabling said current pulse shaping circuit to apply said first current pulse train to said first current loop and said second current pulse train to said second current loop.

8. The current source gate drive circuit of claim 7 wherein said level triggered logic includes serially connected inverters.

9. The current source gate drive circuit of claim 8 wherein said noise lock-out circuit includes a Schmitt trigger positioned between said thyristor firing command logic and said level-triggered logic.

10. A circuit for firing a plurality of thyristors, comprising:

thyristor firing command logic to generate an edge-trigger signal and a level-trigger signal;

edge-triggered logic connected to said thyristor firing command logic, said edge-triggered logic responding to said edge-trigger signal to selectively generate an edge-triggered logic output signal;

noise-lock circuitry connected to said thyristor firing command logic, said noise-lock circuitry including level-triggered logic responsive to said level-trigger signal to selectively generate a pulse train enable signal; and a current pulse generating circuit, connected to said edge-triggered logic and said noise-lock circuitry, for generating a current pulse signal to fire said plurality of thyristors solely in response to said edge-triggered logic output signal and said pulse train enable signal.

11. The circuit of claim 10 wherein said level-triggered logic includes serially connected inverters.

12. The circuit of claim 10 further comprising a Schmitt trigger positioned between said thyristor firing command logic and said level-triggered logic.

* * * * *